(12) United States Patent
Shin

(10) Patent No.: US 10,475,875 B2
(45) Date of Patent: Nov. 12, 2019

(54) DISPLAY DEVICE HAVING A FLEXIBLE CIRCUIT FILM

(71) Applicant: LG Display Co., Ltd., Seoul (KR)

(72) Inventor: Hong-Dae Shin, Gwangmyeong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/043,390

(22) Filed: Jul. 24, 2018

(65) Prior Publication Data

US 2019/0035873 A1  Jan. 31, 2019

(30) Foreign Application Priority Data

Jul. 25, 2017 (KR) .................. 10-2017-0094025

(51) Int. Cl.
*H01L 27/32* (2006.01)
*H05K 7/20* (2006.01)
*H01L 51/52* (2006.01)

(52) U.S. Cl.
CPC ........ *H01L 27/3276* (2013.01); *H01L 51/524* (2013.01); *H01L 51/529* (2013.01); *H05K 7/20963* (2013.01)

(58) Field of Classification Search
CPC . H01L 27/3276; H01L 51/524; H01L 51/529; H05K 7/20963
See application file for complete search history.

(56) References Cited

U.S. PATENT DOCUMENTS

| 2010/0123710 | A1 | 5/2010 | Lee | |
| 2016/0118370 | A1* | 4/2016 | Wu | H01L 25/167 362/19 |
| 2017/0162820 | A1* | 6/2017 | Masumoto | H01L 51/50 |
| 2017/0238446 | A1* | 8/2017 | Wu | G02F 1/133 257/712 |
| 2018/0175324 | A1* | 6/2018 | Fujioka | H01L 51/5253 |

FOREIGN PATENT DOCUMENTS

| JP | 2014-006478 A | 1/2014 |
| WO | 2015/198531 A1 | 6/2017 |

OTHER PUBLICATIONS

Office Action dated Jun. 13, 2019 issued in the corresponding Japanese Patent Application No. 2018-136436 (6 pages).

* cited by examiner

*Primary Examiner* — Sitaramarao S Yechuri
(74) *Attorney, Agent, or Firm* — Polsinelli PC

(57) ABSTRACT

A display device including a display panel and a back cover is provided. In the display device, a flexible circuit film electrically connected to the display panel may be extended between the display panel and the back cover. In the display device, a cover tape is disposed between the flexible circuit film and the back cover. A portion of the flexible circuit film disposed close to an edge of the display panel may be exposed by the cover tape. Thus, the display device may prevent damage of the flexible circuit film due to the outer pressure.

15 Claims, 4 Drawing Sheets

DISPLAY DEVICE HAVING A FLEXIBLE CIRCUIT FILM

CROSS REFERENCE TO RELATED APPLICATION

This application claims the priority benefit of Korean Patent Application No. 10-2017-0094025, filed on Jul. 25, 2017, which is hereby incorporated by reference in its entirety as if fully set forth herein.

BACKGROUND

Field of the Disclosure

The present disclosure relates to a display device comprising a flexible circuit film extended on a surface of the display panel.

Description of the Background

Generally, an electronic appliance, such as a monitor, a TV, a laptop computer, and a digital camera, include a display device to realize an image. For example, the display device includes a liquid crystal display device or an organic light-emitting display device.

The display device includes a display panel having a plurality of pixel regions, and a driver for applying various signal to the display panel. The display device includes a gate driver connected to the display panel by a gate flexible circuit film, and a data driver connected to the display panel by a data flexible circuit film. A driver IC for generating a corresponding signal is mounted on the gate flexible circuit film and the data flexible circuit film, respectively.

In the display device, the flexible circuit films are extended on a surface of the display panel. In the display device, the flexible circuit films which are electrically connected to a pad on a first substrate of the display panel are extended on an outer surface of a second substrate of the display panel which is coupled to the first substrate of the display panel across a side surface of the second substrate of the display panel. The display device further includes a back cover covering the flexible circuit films.

In the display device, the pressing of the display panel can occur due to a coupling process of the back cover or external pressure. When the display panel is pressed, the flexible circuit film can be pressed in the direction of the display panel by the back cover. Thus, in the display device, the flexible circuit film can be damaged by external pressure. Particularly, when the display panel includes a metal substrate separated by a laser, the back cover is disposed on the metal substrate, and the flexible circuit film can be extended between the metal substrate and the back cover, such that wiring of the flexible circuit film can be broken due to a metal burr formed at the edge of the metal substrate by laser cutting process.

SUMMARY

Accordingly, the present disclosure is directed to a display device that substantially obviates one or more problems due to limitations and disadvantages of the related art.

In addition, the present disclosure is to provide a display device capable of preventing the damage of the flexible circuit film due to external pressure.

Further, the present disclosure is to provide a display device in which the pressure applying the flexible circuit film on a side corner of the display panel may be relieved.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display device including a display panel. The display panel includes a first substrate and a second substrate coupled to the first substrate. A back cover is disposed on the second substrate of the display panel. The display panel is electrically connected to a flexible circuit film. The flexible circuit film includes a first film region and a second film region. The first film region and the second film region are disposed side by side. The first film region is disposed between the second substrate and the back cover. A cover tape is disposed between the second film region of the flexible circuit film and the back cover. The first film region is disposed close to a side surface of the second substrate than the second film region.

The cover tape may be in direct contact with the flexible circuit film and the back cover.

The flexible circuit film may further include a third film region between the second substrate and the back cover. A driver IC may be mounted on the third film region. The second film region may be disposed between the first film region and the third film region.

The second substrate may include a metal.

The cover tape may include a first cover tape and a second cover tape. The first cover tape may be disposed on a side surface of the flexible circuit film. The second cover tape may be disposed on the second film region of the flexible circuit film.

The second cover tape may be extended in a width direction of the flexible circuit film. A length of the second cover tape may be larger than a width of the flexible circuit film.

The second cover tape may include a material different from the first cover tape.

A thickness of the first cover tape may be same as a thickness of the flexible circuit film.

The first cover tape may be extended in a length direction of the flexible circuit film.

A length of the first cover tape may be smaller than a length of the flexible circuit film between the second substrate and the back cover.

In another aspect, a display device includes a display panel. The display panel includes a first substrate and a second substrate coupled to the first substrate. A cover tape is disposed on the second substrate of the display panel. The cover tape exposes an edge of the second substrate. A back cover is disposed on the cover tape. The back cover includes a region overlapping with the display panel. The display panel is electrically connected to a flexible circuit films. Each of the flexible circuit films crosses between the second substrate and the cover tape.

A heat radiation element may be disposed between the cover tape and the back cover.

The cover tape may include a first tape region and a second tape region. The first tape region may overlap the flexible circuit films. The second tape region may be disposed between the flexible circuit films.

A length of the second tape region may be larger than a length of the first tape region in a length direction of the flexible circuit films.

A thickness of the second tape region may be same as a thickness of the first tape region.

The second substrate may include a metal burr disposed at the edge thereof. The cover tape may be spaced away from the metal burr.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Figure 1:
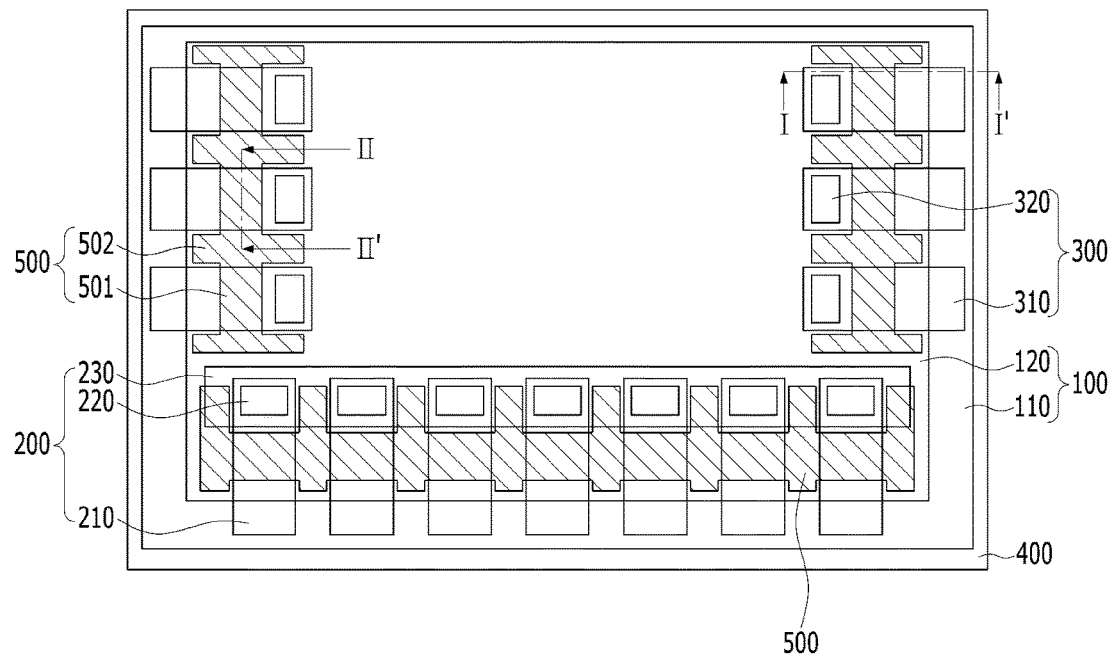
FIG. 1 is a view schematically showing a display device according to an aspect of the present disclosure.

Hereinafter, details related to the above technical configurations and operational effects of the aspects of the present disclosure will be clearly understood by the following detailed description with reference to the drawings, which illustrate some aspects of the present disclosure. Here, the aspects of the present disclosure are provided in order to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2A:
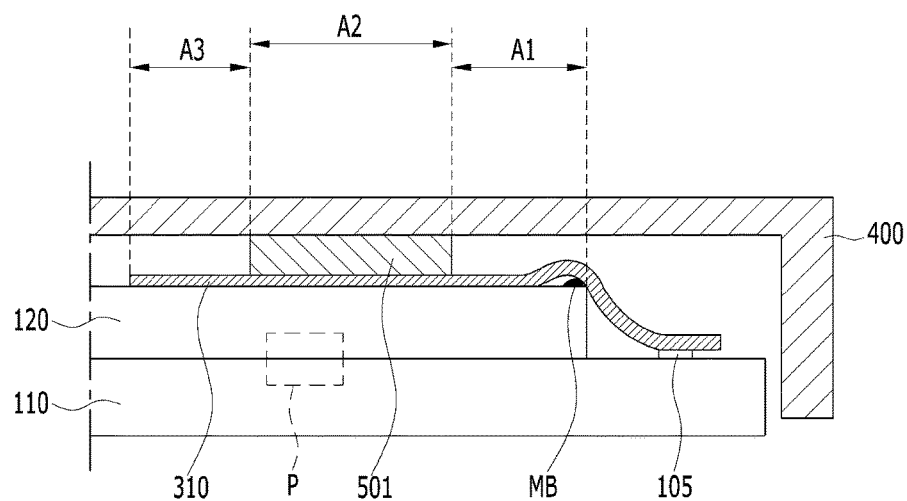
FIG. 2A is a view taken along I-I' of FIG. 1.
Figure 2B:
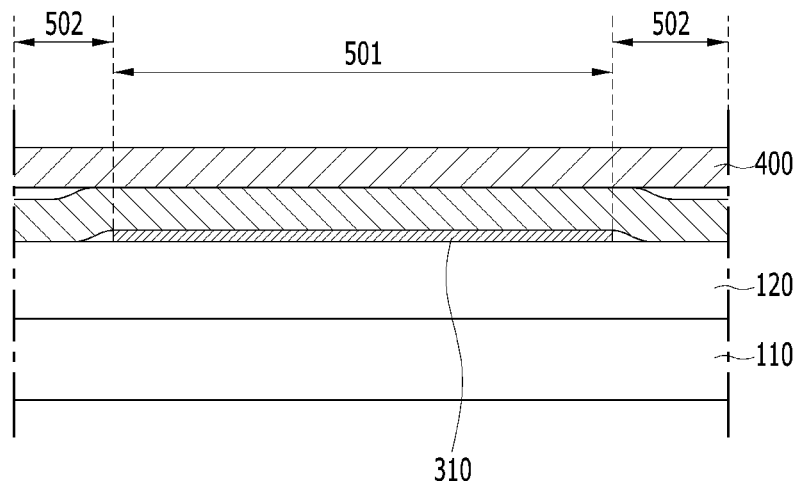
FIG. 2B is a view taken along II-II' of FIG. 1.
Figure 2C:
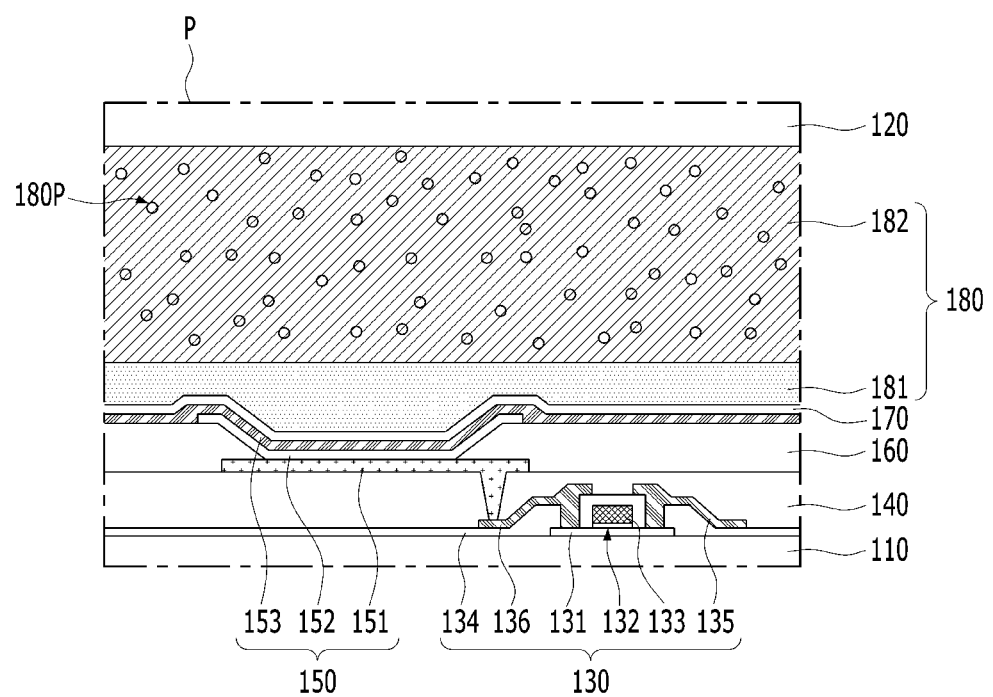
FIG. 2C is an enlarged view of region P in FIG. 2A.

FIG. 1 is a view schematically showing a display device according to an aspect of the present disclosure. FIG. 2A is a view taken along I-I' of FIG. 1. FIG. 2B is a view taken along II-II' of FIG. 1. FIG. 2C is an enlarged view of region P in FIG. 2A.

Referring FIGS. 1 and 2A to 2C, the display device according to the aspect of the present disclosure may include a display panel 100. The display panel 100 may include a first substrate 110 and a second substrate 120 coupled to the first substrate 110.

The first substrate 110 may include an insulating material. The first substrate 110 may include a transparent material. For example, the first substrate 110 may include glass or plastic.

The second substrate 120 may include a material different from the first substrate 110. The second substrate 120 may include a material having a certain level of hardness. For example, the second substrate 120 may include a metal.

The second substrate 120 may have a size smaller than the first substrate 110. For example, the second substrate 120 may expose an edge of the first substrate 110. A pad 105 may be disposed on the edge of the first substrate 110 exposed by the second substrate 120.

Pixel areas may be disposed between the first substrate 110 and the second substrate 120. An emissive element or a variable transmittance element may be disposed on each the pixel area. For example, in the display device according to the aspect of the present disclosure, a thin film transistor 130 and a light-emitting structure 150 may be stacked on each pixel area, as shown in FIG. 2C. The display panel 100 may further include lines for connecting the thin film transistor 130 and the light-emitting structure 150 to the pad 105.

The thin film transistor 130 may be disposed between the first substrate 110 and the light-emitting structure 150. For example, the thin film transistor 130 may include a semiconductor pattern 131, a gate insulating layer 132, a gate electrode 133, an interlayer insulating layer 134, a source electrode 135 and a drain electrode 136.

The semiconductor pattern 131 may include a semiconductor material. For example, the semiconductor pattern 131 may include amorphous silicon or poly-silicon. The semiconductor pattern 131 may include an oxide semiconductor material. For example, the semiconductor pattern 131 may include IGZO.

The semiconductor pattern 131 may include a source region, a drain region and a channel region. The channel region may be disposed between the source region and the drain region. The channel region may have conductivity lower than the source region and the drain region. For example, the source region and the drain region may include a conductive impurity.

The gate insulating layer 132 and the gate electrode 133 may sequentially stacked on the semiconductor pattern 131. The gate electrode 133 may be insulated from the semiconductor pattern 131 by the gate insulating layer 132. The gate electrode 133 may overlap the channel region of the semiconductor pattern 131. For example, the gate insulating layer 132 may be disposed between the channel region of the semiconductor pattern 131 and the gate electrode 133.

The gate insulating layer 132 may include an insulating material. For example, the gate insulating layer 132 may include silicon oxide and/or silicon nitride. The gate insulating layer 132 may include high-K material. For example, the gate insulating layer 132 may include hafnium oxide (HfO) or titanium oxide (TiO). The gate insulating layer 132 may have a multi-layer structure.

The gate electrode 133 may include a conductive material. For example, the gate electrode may include a metal, such as aluminum (Al), chrome (Cr), capper (Cu), titanium (Ti), molybdenum (Mo) and tungsten (W).

The interlayer insulating layer 134 may be disposed on the semiconductor pattern 131 and the gate electrode 133. The interlayer insulating layer 134 may be extended beyond the semiconductor pattern 131. For example, the interlayer insulating layer 134 of each pixel area may be coupled to the interlayer insulating layer 134 of adjacent pixel area. The semiconductor pattern 131 and the gate electrode 133 may be surrounded by the interlayer insulating layer 134.

The interlayer insulating layer 134 may include an insulating material. For example, the interlayer insulating layer 134 may include silicon oxide.

The source electrode 135 and the drain electrode 136 may be disposed on the interlayer insulating layer 134. The source electrode 135 may be electrically connected to the source region of the semiconductor pattern 131. The drain electrode 136 may be electrically connected to the drain region of the semiconductor pattern 131. The drain electrode 136 may be spaced away from the source electrode 135. For example, the interlayer insulating layer 134 may include a contact hole exposing at least a portion of the source region of the semiconductor pattern 131, and a contact hole exposing at least a portion of the drain region of the semiconductor pattern 131.

The source electrode 135 and the drain electrode 136 may include a conductive material. For example, the source electrode 135 and the drain electrode 136 may include a metal, such as aluminum (Al), chrome (Cr), capper (Cu), titanium (Ti), molybdenum (Mo) and tungsten (W). The drain electrode 136 may include a material the same as the source electrode 135. The gate electrode 133 may include a material different from the source electrode 135 and the drain electrode 136.

An over-coat layer 140 may be disposed between the thin film transistor 130 and the light-emitting structure 150. The over-coat layer 140 may remove a thickness difference due to the thin film transistor 130. For example, a surface of the over-coat layer 140 facing the second substrate 120 may be a flat surface. The over-coat layer 140 may include an insulating material. For example, the over-coat layer 140 may include an organic insulating material.

The light-emitting structure 150 may be disposed between the over-coat layer 140 and the second substrate 120. The light-emitting structure 150 may generate light realizing a specific color. For example, the light-emitting structure 150 may include a lower electrode 151, a light-emitting layer 152 and an upper electrode 153, which are sequentially stacked.

The light-emitting structure 150 may be controlled by the thin film transistor 130. For example, the lower electrode 151 of the light-emitting structure 150 may be electrically connected to the drain electrode 136 of the thin film transistor 130. The over-coat layer 140 may include a contact hole partially exposing the drain electrode 136 of the thin film transistor 130.

The lower electrode 151 may include a conductive material. The lower electrode 151 may be a transparent electrode. For example, the lower electrode 151 may include ITO and/or IZO.

The light-emitting layer 152 may generate light have luminance corresponding to a voltage difference between the lower electrode 151 and the upper electrode 153. For example, the light-emitting layer 152 may include an emission material layer (EML). The emission material may include an organic material, an inorganic material or a hybrid material. For example, the display device according to the aspect of the present disclosure may be an organic light-emitting display device having an organic light-emitting layer.

The light-emitting layer 152 may have a multi-layer structure in order to increase luminous efficacy. For example, the light-emitting layer 152 may further include at least one of a hole injection layer (HIL), a hole transporting layer (HTL), an electron transporting layer (ETL), and an electron injection layer (EIL).

The upper electrode 153 may include a conductive material. The upper electrode 153 may have a structure different from the lower electrode 151. For example, the upper electrode 153 may include a metal. Thus, in the display device according to the aspect of the present disclosure, the light generated by the light-emitting layer 152 may be emitted to the outside through the first substrate 110. The upper electrode 153 may include a metal having high reflectance, such as aluminum (Al) and silver (Ag). Therefore, in the display device according to the aspect of the present disclosure, the emission efficacy of the light-emitting structure 150 can be increased.

In the display device according to the aspect of the present disclosure, the light-emitting structure on each pixel area may be driven, independently. For example, in the display device according to the aspect of the present disclosure, an edge of the lower electrode 151 may be covered by a bank insulating layer 160. The light-emitting layer 152 and the upper electrode 153 may be stacked on the lower electrode exposed by the bank insulating layer 160. The bank insulating layer 160 may include an insulating material. For example, the bank insulating layer 160 may include an organic insulating material. The bank insulating layer 160 may include a material different from the over-coat layer 140.

The light-emitting layer 152 and the upper electrode 153 may be extended on the bank insulating layer 160. For example, the light-emitting layer 152 and the upper electrode 153 of each light-emitting structure 150 may be coupled to the light-emitting layer 152 and the upper electrode 153 of adjacent light-emitting structure 150. An upper passivation layer 170 may be disposed on the upper electrode 153. The upper passivation layer 170 may prevent the light-emitting structure 150 from external impact and moisture. The upper passivation layer 170 may include an insulating material. The upper passivation layer 170 may have a multi-layer structure. For example, the upper passivation layer 170 may have a structure in which an organic layer including an organic insulating material is disposed between inorganic layers including an inorganic insulating material.

An encapsulating layer 180 may be disposed between the upper passivation layer 170 and the second substrate 120. The second substrate 120 may be in direct contact with the encapsulating layer 180. The second substrate 120 may be coupled to the first substrate 110 in which the thin film transistor 130 and the light-emitting structure 150 is formed, by the encapsulating layer 180.

The encapsulating layer 180 may prevent the permeation of external moisture. For example, the encapsulating layer 180 may include a moisture absorbing material 180p.

The encapsulating layer 180 may have a multi-layer structure. For example, the encapsulating layer 180 may include a first encapsulating layer 181 and a second encapsulating layer 182, which are sequentially stacked on the upper passivation layer 170. The moisture absorbing material 180p may be disposed in the second encapsulating layer 182. Thus, in the display device according to the aspect of the present disclosure, the stress applied to the light-emitting structure 150 due to expansion of the moisture absorbing material 180p may be relieved by the first encapsulating layer 181. The first encapsulating layer 181 may include a material different from the second encapsulating layer 182.

The display panel 100 may be electrically connected to a data driver 200 and a gate driver 300. The data driver 200 may apply a data signal to the display panel 100. For example, the data driver 200 may include source flexible circuit films 210 electrically connected to the display panel 100 by the pad 105, and source driver ICs 220 respectively mounted on the corresponding source flexible circuit film 210. The data drive 200 may further comprise a source printed circuit board 230 connected to the display panel 100 by the source flexible circuit films 210. The gate driver 300 may apply a gate signal to the display panel 100. For example, the gate driver 300 may include gate flexible circuit films 310 electrically connected to the display panel 100 by the pad 105, and gate driver ICs 320 respectively mounted on the corresponding gate flexible circuit film 310.

The source flexible circuit films 210 and the gate flexible circuit films 310 may be extended on an outer surface of the second substrate 120. For example, the source drive ICs 220 and the gate driver ICs 320 may be disposed on the outer surface of the second substrate 120. The source printed circuit board 230 may be disposed on the outer surface of the second substrate 120.

Each of the flexible circuit films 210 and 310 may include a first film region A1, a second film region A1 and a third film region A3, which are disposed on the outer surface of the second substrate 120. The first film region A1, the second film region A2 and the third film region A3 may be disposed side by side in a length direction of the corresponding flexible circuit film 210 and 310. For example, the second film region A2 may be disposed between the first film region A1 and the third film region A3. The flexible circuit films 210 and 310 may cross a side surface of the second substrate 120, respectively. The first film region A1 may be disposed close to the side surface of the second substrate 120 across which the corresponding flexible circuit film 210 and 310 intersects. The second film region A2 may be spaced away from an edge of the second substrate 120 by a predetermined distance. The driver IC 220 and 320 of the corresponding flexible circuit film 210 and 310 may be mounted on the third film region A3.

A back cover 400 may be disposed on the data driver 200 and the gate driver 300. The back cover 400 may prevent damage of the display panel 100, the data driver 200 and the gate driver 300 due to the external impact. For example, the back cover 400 may include a portion overlapping with the display panel 100. The source driver ICs 220, the gate driver ICs 320 and the source printed circuit board 230 may be disposed between the second substrate 120 and the back cover 400. The back cover 400 may include a portion disposed on a side surface of the display panel 100. For example, the side surfaces of the second substrate 120 may be covered by the back cover 400.

The back cover 400 may include an insulating material. The back cover 400 may include a material having a hardness of at least a certain level. For example, the back cover 400 may include plastic.

Cover tapes 500 may be disposed between the flexible circuit films 210 and 310, and the back cover 400. Each of the flexible circuit films 210 and 310 may cross between the second substrate 120 and the corresponding cover tape 500. Each of the cover tapes 500 may be extended along a side surface of the second substrate 120. For example, the flexible circuit films 210 and 310 which cross the same side surface of the second substrate 120 may intersect with single cover tape 500. Each of the cover tapes 500 may include a first tape region (first cover tape) 501 overlapping with the flexible circuit films 210 and 310, and a second tape region (second cover tape) 502 disposed between the flexible circuit films 210 and 310.

The first tape region 501 may be in direct contact with the corresponding flexible circuit film 210 and 310, and the back cover 400. Thus, in the display device according to the aspect of the present disclosure, gap between the flexible circuit films 210 and 310, and the back cover 400 may be maintained even if external pressure is applied. The first tape region 501 may be disposed between the second film region A2 of each flexible circuit film 210 and 310, and the back cover 400. That is, in the display device according to the aspect of the present disclosure, each cover tape 500 may expose an edge of the second substrate 120 overlapping the flexible circuit films 210 and 310. Therefore, in the display device according to the aspect of the present disclosure, even if the flexible circuit films 210 and 310 are closely attached to the display panel 100 due to external pressure, the pressure applied to the flexible circuit films 210 and 310 disposed on a side corner of the display panel 100, may be relieved. Thereby, the display device according to the aspect of the present disclosure may prevent damage of the flexible circuit films 210 and 310 due to by-products such as metal burr MB generated at an edge of the second substrate 120 by cutting process.

The second tape region 502 may be extended in a length direction of the corresponding flexible circuit films 210 and 310. For example, the second tape region 502 may be extended on a side surface of the first film region A1 and the third film region A3 of the corresponding flexible circuit films 210 and 310. A length of the second tape region 502 may be larger than a length of the first tape region 501 in the length direction of the corresponding flexible circuit films 210 and 310. The length of the second tape region 502 in the length direction of the corresponding flexible circuit films 210 and 310 may be a length of the corresponding flexible circuit films 210 and 310 between the second substrate 120 and the back cover 400. For example, the cover tape 500 may have 'H' shape or 'I' shape at the periphery of each flexible circuit film 210 and 310. Thus, in the display device according to the aspect of the present disclosure, damage of the flexible circuit films 210 and 310 due to the external impact may be sufficiently prevented, and damage and malfunction of the driver ICs 220 and 320 due to the cover tapes 500 may be prevented.

The second tape region 502 may have a thickness same as the first tape region 501. For example, the second tape region 502 may be in direct contact with the second substrate 120, and may be spaced away from the back cover 400. Thus, in the display device according to the aspect of the present disclosure, a distance between the second substrate 120 and the back cover 400, and a distance between the flexible circuit films 210 and 310 and the back cover 400 may be maintained when the cover tapes 500 is misaligned. That is, in the display device according to the aspect of the present disclosure, a process margin for attaching process of the cover tapes 500 may be improved.

Accordingly, in the display device according to the aspect of the present disclosure, damage of the flexible circuit films 210 and 310 due to a side corner of the display panel 100 when the external impact is applied, may be prevented by the cover tapes 500 which is disposed between the flexible circuit films 210 and 310 and the back cover 400 and exposes an edge of the second substrate 120. Thus, in the display device according to the aspect of the present disclosure, the reliability may be increased.

Figure 3:
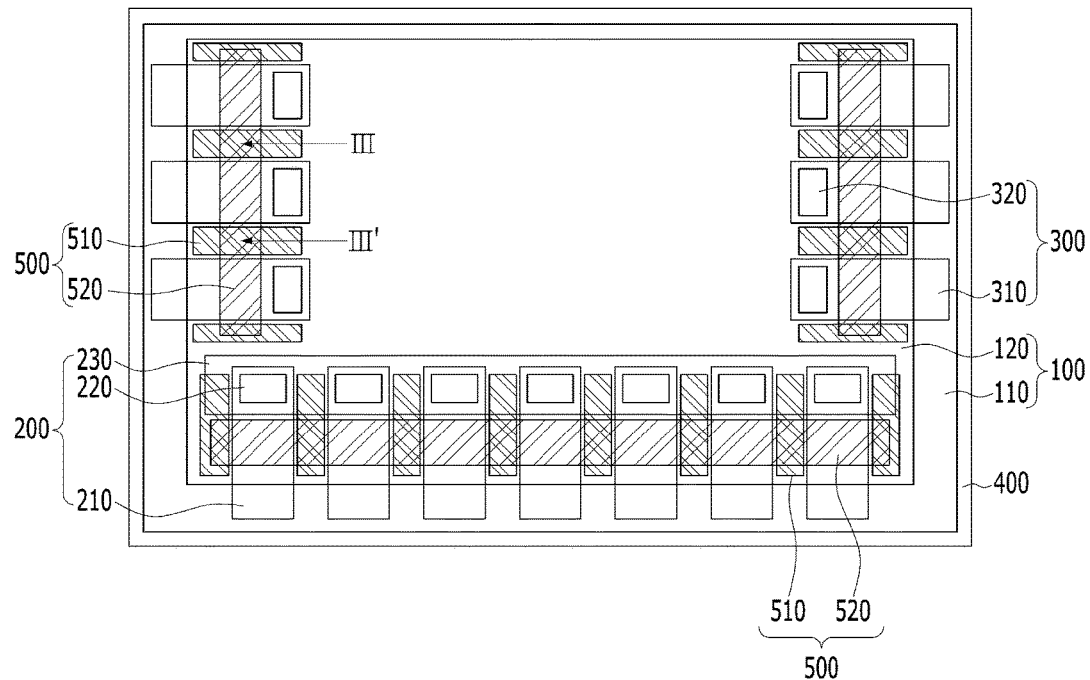
FIGS. 3, 5 and 6 are views respectively showing a display device according to another aspect of the present disclosure.
Figure 4:
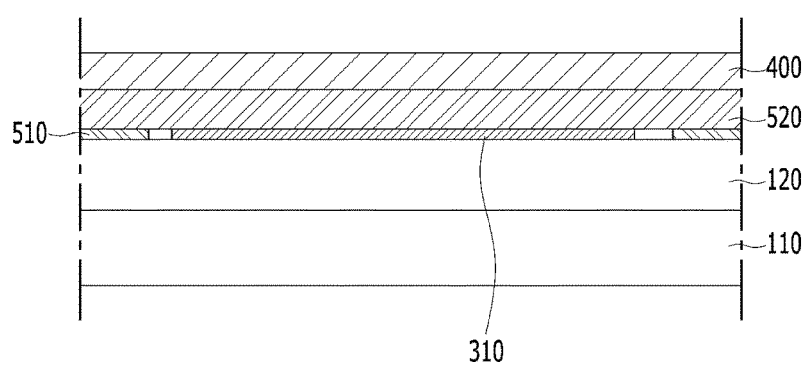
FIG. 4 is a view taken along III-III' of FIG. 3.

The display device according to the aspect of the present disclosure is described that the flexible circuit films 210 and 310 which cross the same side surface of the second substrate 120, intersects with same cover tape 500. However, in the display device according to another aspect of the present disclosure, the various type cover tapes 500 may be used. For example, in the display device according to another aspect of the present disclosure, each cover tape 500 may include a first cover tapes 510 extended in a direction, and a second cover tape 520 across the first cover tapes 510, as shown in FIGS. 3 and 4.

The first cover tapes 510 may be disposed on a side of the flexible circuit films 210 and 310. The first cover tapers 510 may be spaced away from the corresponding flexible circuit films 210 and 310. The first cover tapes 510 may be extended in a length direction of the corresponding flexible circuit films 210 and 310. For example, a length of the first cover tapes 510 may be shorter than a length of the flexible circuit films 210 and 310 between the second substrate 120 and the back cover 400.

The second cover tape 520 may cross the first cover tapes 510. For example, the second cover tape 520 may be extended along the side surface of the second substrate 120. The second cover tape 520 may cross the flexible circuit films 210 and 310 intersecting the side surface of the second substrate 120. The second cover tape 520 may expose an edge of the second substrate 120. For example, the second cover tape 520 may be extended in a width direction of the corresponding flexible circuit films 210 and 310 on the second film regions A2 of the flexible circuit films 210 and 310. That is, in the display device according to another aspect of the present disclosure, after attaching the first cover tapes 510 on a side of the flexible circuit films 210 and 310, the second cover tape 520 intersecting the corresponding flexible circuit films 210 and 310 and the corresponding first cover tapes 510, may be attached. Thus, in the display device according to another aspect of the present disclosure, miss-alignment of the cover tapes 500 may be reduced.

The first cover tapes 510 may have a thickness different from the second cover tape 520. For example, a thickness of the first cover tapes 510 may be same as a thickness of the corresponding flexible circuit films 210 and 310. Thus, in the display device according to another aspect of the present disclosure, increasing the overall thickness due to the cover tapes 500 may be prevented. The first cover tapes 510 may include a material different from the second cover tape 520.

Figure 5:
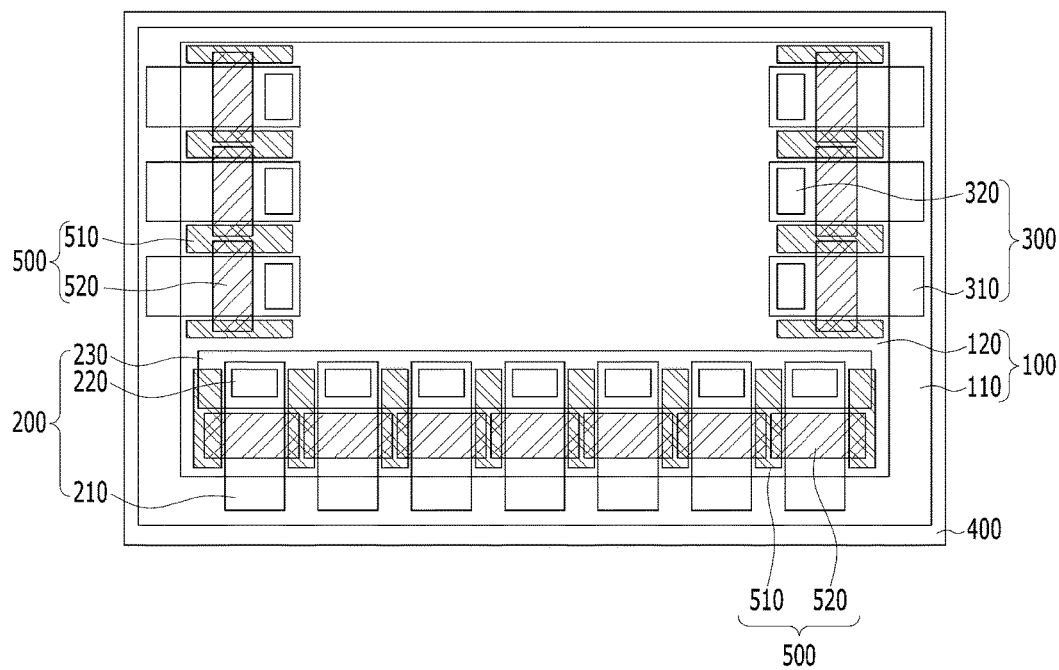

The display device according to another aspect of the present disclosure is described that single second cover tape 520 intersects the flexible circuit films 210 and 310 crossing the same side surface of the second substrate 120. However, in the display device according to further another aspect of the present disclosure, the second cover tapes 520 separated from each other may be disposed on the flexible circuit films 210 and 310 crossing same side surface of the second substrate 120, as shown in FIG. 5. That is, in the display device according to further another aspect of the present disclosure, each flexible circuit film 210 and 310 may cross the corresponding second cover tape 520. Thus, in the display device according to further another aspect of the present disclosure, location of the second cover tape 520 attached on each flexible circuit film 210 and 310 may be adjusted, easily. Therefore, in the display device according to further another aspect of the present disclosure, misalign of the cover tapes 500 may be reduced, efficiently.

Figure 6:
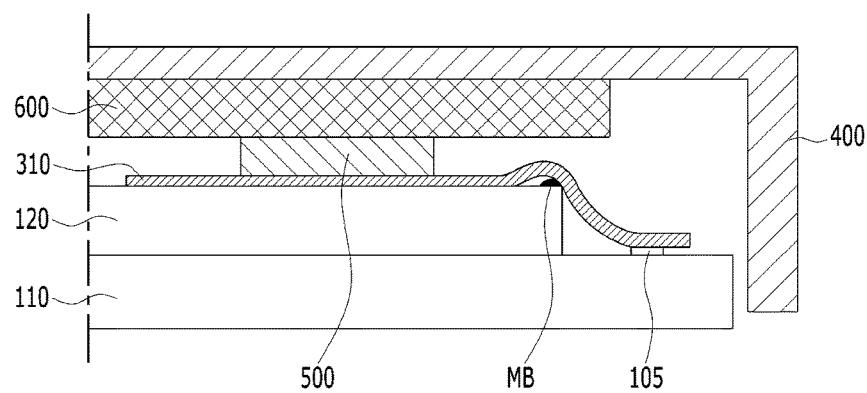

The display device according to the aspect of the present disclosure is described that the cover tape 500 is in direct contact with the back cover 400. However, in the display device according to another aspect of the present disclosure, at least one functional layer may be disposed between the cover tape 500 and the back cover 400. For example, the display device according to another aspect of the present disclosure may further include a heat radiation element 600 disposed between the cover tape 500 and the back cover 400, as shown in FIG. 6. The heat radiation element 600 may be extended beyond the cover tape 500. Thus, in the display device according to another aspect of the present disclosure, damage of the flexible circuit films 210 and 310 due to the external impact may be efficiently prevented.

In the result, the display device according to the aspects of the present disclosure may relieve a pressure applied in a side corner direction of the display panel by using the cover tape between flexible circuit film and the back cover. Thus, in the display device according to the aspects of the present disclosure, damage of the flexible circuit films due to the external impact may be prevented. Thereby, in the display device according to the aspects of the present disclosure, reliability may be increased.

What is claimed is:

1. A display device comprising:
a display panel including a first substrate and a second substrate coupled to the first substrate;
a back cover disposed on the second substrate of the display panel;
a flexible circuit film electrically connected to the display panel, the flexible circuit film including a first film region and a second film region disposed side by side the first film region in a longitudinal direction between the second substrate and the back cover; and
a cover tape disposed between the second film region of the flexible circuit film and the back cover, the cover tape including a first cover tape disposed on a side surface of the flexible circuit film, and a second cover tape disposed on the second film region of the flexible circuit film,
wherein the first film region is disposed closer to an outermost surface of the second substrate than the second film region, and
wherein the first cover tape is extended in a length direction of the flexible circuit film.

2. The display device according to claim 1, wherein the cover tape is in contact with the flexible circuit film and the back cover.

3. The display device according to claim 1, wherein the flexible circuit films further includes a third film region on which a driver IC is mounted,
wherein the third film region is disposed between the second substrate and the back cover, and wherein the second film region is disposed between the first film region and the third film region.

4. The display device according to claim 1, wherein the second substrate includes metal.

5. The display device according to claim 1, wherein the second cover tape is extended in a width direction of the flexible circuit film, and wherein a length of the second cover tape is larger than a width of the flexible circuit film.

6. The display device according to claim 1, wherein the second cover tape includes a material different from the first cover tape.

7. The display device according to claim 1, wherein a thickness of the first cover tape is same as a thickness of the flexible circuit film.

8. The display device according to claim 1, wherein a length of the first cover tape is smaller than a length of the flexible circuit film between the second substrate and the back cover.

9. A display device comprising:
a display panel including a first substrate and a second substrate coupled to the first substrate;
a cover tape on the second substrate of the display panel, the cover tape exposing an edge of the second substrate, the cover tape including a first tape region overlapping the flexible circuit films, and a second tape region between the flexible circuit films;
a back cover disposed on the cover tape and including a region overlapping the display panel; and
flexible circuit films disposed between the second substrate and the cover tape, each of the flexible circuit films electrically connected to the display panel,
wherein a length of the second tape is larger than a length of the first tape in a length direction of the flexible circuit films.

10. The display device according to claim 9, further comprising a heat radiation element between the cover tape and the back cover.

11. The display device according to claim 9, wherein the first and second tape regions have a same thickness.

12. The display device according to claim 9, wherein the second substrate include a metal burr disposed at an edge thereof, and
wherein the cover tape is spaced away from the metal burr.

13. A display device comprising:
a display panel including first and second substrates facing each other;
a flexible circuit film electrically connected to the display panel and extended to an outermost side surface of the second substrate and attached to the first substrate;
a back cover protecting the flexible circuit film by enclosing the first and second substrates; and
a cover tape disposed between the flexible circuit film and the back cover and providing a space between the flexible circuit films and the back cover,
wherein the cover tape includes a first cover tape disposed on a side surface of the flexible circuit film, and a second cover tape disposed on the second film region of the flexible circuit film, and
wherein the first cover tape is extended with respect to a length direction of the flexible circuit film.

14. The display device according to claim 13, further comprising a pad electrically connecting the flexible circuit films and the first substrate.

15. The display device according to claim 13, wherein the flexible circuit film includes first, second and third film regions, wherein the second film region is disposed between the first film region and the third film region, and the third film region where a driver IC is mounted is disposed between the second substrate and the back cover.

* * * * *